(12) United States Patent  
Kuwata

(10) Patent No.: US 7,856,074 B2
(45) Date of Patent: Dec. 21, 2010

(54) SIGNAL PROCESSING SYSTEM

(75) Inventor: Naoki Kuwata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1597 days.

(21) Appl. No.: 11/042,091

(22) Filed: Jan. 26, 2005

(65) Prior Publication Data

US 2005/0129158 A1    Jun. 16, 2005

Related U.S. Application Data

(63) Continuation of application No. PCT/JP02/11461, filed on Nov. 1, 2002.

(51) Int. Cl.
*H04L 25/00* (2006.01)
*H04L 7/00* (2006.01)

(52) U.S. Cl. .................. 375/371; 375/346; 375/362; 375/285

(58) Field of Classification Search .......... 375/371, 375/372, 376, 295, 296
See application file for complete search history.

(56) References Cited

U.S. PATENT DOCUMENTS

| | | | | |
|---|---|---|---|---|
| 5,483,559 A * | 1/1996 | Yamashita | ............ | 375/376 |
| 5,666,387 A * | 9/1997 | Tamamura et al. | ........ | 375/371 |
| 6,509,769 B2 * | 1/2003 | Dauth | ............ | 327/156 |
| 6,539,072 B1 * | 3/2003 | Donnelly et al. | ........ | 375/371 |
| 6,653,874 B2 * | 11/2003 | Ishikawa | ............ | 327/144 |
| 6,879,651 B2 * | 4/2005 | Saeki | ............ | 375/371 |
| 7,167,534 B2 * | 1/2007 | Nakamura | ........ | 375/373 |
| 7,206,370 B2 * | 4/2007 | Nakao | ............ | 375/376 |
| 7,236,024 B2 * | 6/2007 | Huang et al. | ........ | 327/147 |
| 2002/0196885 A1 * | 12/2002 | Kim et al. | ........ | 375/357 |
| 2003/0117190 A1 * | 6/2003 | Ito | ............ | 327/156 |
| 2005/0008111 A1 * | 1/2005 | Suzuki | ........ | 375/371 |

FOREIGN PATENT DOCUMENTS

| | | |
|---|---|---|
| JP | 4-78840 | 7/1992 |
| JP | 6-296173 | 10/1994 |
| JP | 8-256138 | 10/1996 |
| JP | 10-107786 | 4/1998 |
| JP | 2000-224152 | 8/2000 |

* cited by examiner

*Primary Examiner*—Chieh M Fan
*Assistant Examiner*—Qutbuddin Ghulamali
(74) *Attorney, Agent, or Firm*—Staas & Halsey LLP

(57) ABSTRACT

A data processing circuit includes: a first circuit part having a first synchronization signal; a second circuit part having a second synchronization signal, and receiving a data signal and the first synchronization signal from the first circuit part; a phase comparing part carrying out phase comparison between the second synchronization signal and the first synchronization signal in the second circuit part; and a control part controlling a phase of the first synchronization signal based on a comparison result of the phase comparing part.

6 Claims, 10 Drawing Sheets

SIGNAL PROCESSING SYSTEM

CROSS-REFERENCE TO RELATED APPLICATION

This application is a U.S. continuation application filed under 35 USC 111(a) claiming benefit under 35 USC 120 and 365(c) of PCT application JP02/11461, filed on Nov. 1, 2002.

BACKGROUND OF THE INVENTION

1. Field of the Invention

The present invention relates to a data processing circuit and a signal processing system, and, in particular, to a data processing circuit and a signal processing system in which, in a multiplexing/demultiplexing circuit of a high-speed optical communication or such, when parallel data signals are transmitted at a high speed, phase adjustment to an internal operation clock signal provided of a circuit receiving the parallel data signals can be carried out accurately.

2. Description of the Related Art

For example, in an optical communication system carrying out optical transmission at a very high data transfer rate such as 40 Gb/s, signal transmission of parallel data signals of 622 Mb/s×64 channels, 2.5 Gb/s×16 channels or such are carried out between respective circuits inside of a transmission apparatus. In order to achieve precise signal transmission without data error in transmission of such parallel data signals, it is necessary to establish phase synchronization between a transmission side circuit and a reception side circuit for each signal. However, a transmission length between the circuits, a delay time occurring inside of an IC or such is not fixed, and thus, a fluctuation may occur therein. Thereby, a phase difference may occur among the signals transmitted in parallel, which may result in a signal error. In particular, as the signal transmission rate increases, influence of such a delay time increases accordingly. In fact, in a case of a very high transmission rate such as 40 Gb/s, fluctuation in such a delay time, which could have been ignored until then, will directly result in a signal error. Therefore, a measure enabling accurate phase adjustment is demanded.

Japanese Laid-open Patent Application No. 10-107786 discloses a method in which a separation of phase between an input side frame and an output side frame is monitored, and, a timing of a frame signal is determined in such a manner that the phase separation therebetween may have a proper amount. However, according to this method, an input signal should be once held by a parallel buffer. For this purpose, a large size of the parallel buffer is required, and also, a signal delay necessarily occurs since a sufficiently large separation should be provided between the input and the output in this method.

SUMMARY OF THE INVENTION

The present invention has been devised in consideration of the above-mentioned situation, and, an object of the present invention is to provide a configuration by which, for parallel signal transmission between circuits of high speed data transmission as mentioned above, it becomes possible to establish phase synchronization among parallel signals at a reception side circuit with a relatively simple circuit configuration.

According to the present invention, a phase relationship between a synchronization signal transmitted from a transmission side circuit part and a synchronization signal of a reception side circuit part is detected in the reception side circuit part, and, based on the detection result, a phase of the synchronization signal of the transmission side circuit part is controlled. Thereby, at the reception side circuit part, a phase difference between the synchronization signal of the reception side circuit part itself and received data signals transmitted from the transmission side circuit part is thus well controlled. Accordingly, the reception side circuit part can easily establish phase synchronization of the received data signals with the use of the synchronization signal of its own.

BRIEF DESCRIPTION OF THE DRAWINGS

Other objects and further features of the present invention will become more apparent from the following detailed description when read in conjunction with the accompanying drawings.

DETAILED DESCRIPTION OF THE PREFERRED EMBODIMENTS

Embodiments of the present invention will be described with reference to figures.

Figure 1:
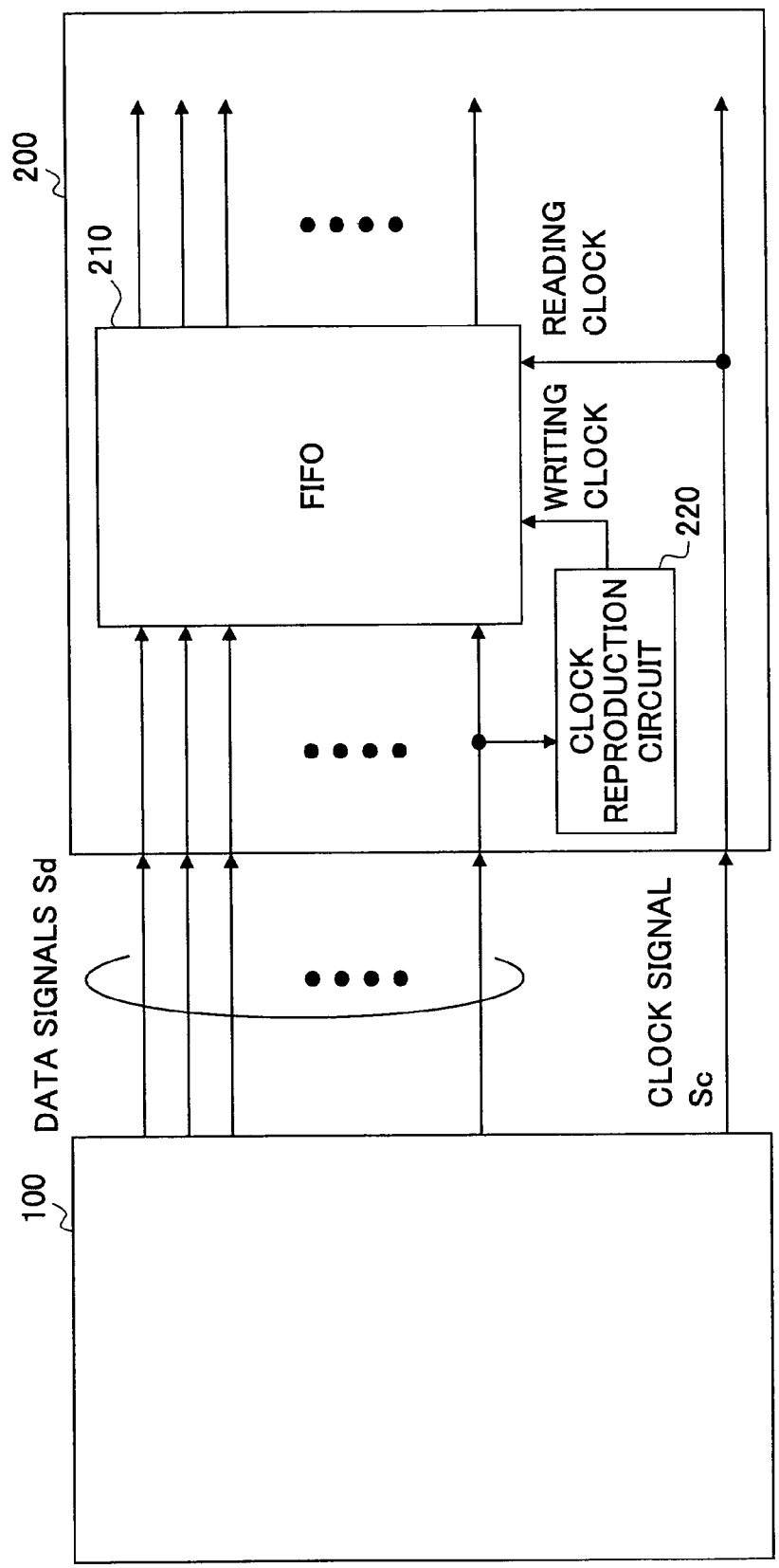
FIG. 1 shows a circuit configuration example for a case where phase synchronization is carried out with the use of a FIFO.

In a data processing circuit carrying out high speed parallel data transmission, when parallel data signals are transferred between circuits, the following two alternative methods may be applied: a first method (1) in which signal transmission is carried out without concerning a phase relation to a synchronization clock signal, and then, a phase difference between the signals is absorbed inside of the circuit at the reception side; and a second method (2) in which a phase relationship is previously prescribed, and signal transmission is carried out in such a manner that the phase difference may be controlled within a predetermined value. As one exmaple of the above-mentioned first method (1), a buffer in a type of FIFO (first in first out) may be used. FIG. 1 shows a block diagram of a data processing circuit for this case.

In a configuration of FIG. 1, for example, a first data processing circuit 100 is a circuit outputting parallel data signals Sd at a transmission rate of 2.5 Gb/s, while a second data processing circuit 200 is a circuit multiplexing the parallel data signals, and outputting the data serially at a transmission rate of 40 Gb/s.

In a case of the circuit configuration of FIG. 1, a phase relationship between the parallel data signals Sd input to the data processing circuit 200 and a synchronization clock signal Sc may be an arbitrary one. The received parallel data signals Sd are synchronized with the clock signal Sc by a predetermined function of the FIFO circuit 210, which clock signal is transmitted between the circuits. After that, the thus-synchronized data signals Sd are transferred to a circuit in a next stage. A clock reproduction circuit 220 shown is a circuit generating a clock signal in phase with the received parallel signals Sd, based on a signal timing of the received signals Sd.

That is, in the FIFO circuit 210, the received signals Sd are once written in an internal buffer in synchronization with the clock signal generated by the clock reproduction circuit 220, and the thus-written data is then read out in synchronization with the clock signal Sc of the reception side circuit 200. As a result, the parallel data signals Sd are output to the subsequent circuit in a condition of precisely in synchronization with the synchronization clock signal Sc of the reception side circuit 200.

In this configuration, even for a case where the output phase relationship between the data signals Sd and the clock signal Sc in the transmission side circuit 100 or the connecting transmission path length between the circuits amounts to a large value, or for a case where such a factor fluctuates for a large amount, a delay time among the received signals occurring accordingly can be absorbed by the above-mentioned function of the FIFO circuit 210. Thereby, it is possible to positively avoid signal error otherwise occurring due to such signal delay fluctuation. However, in order to absorb such a large amount of signal delay, it is necessary to increase a circuit size of the FIFO circuit 210 or the clock reproduction circuit 220, and as a result, a circuit size of the entire circuit 200 may increase accordingly.

Figure 2:
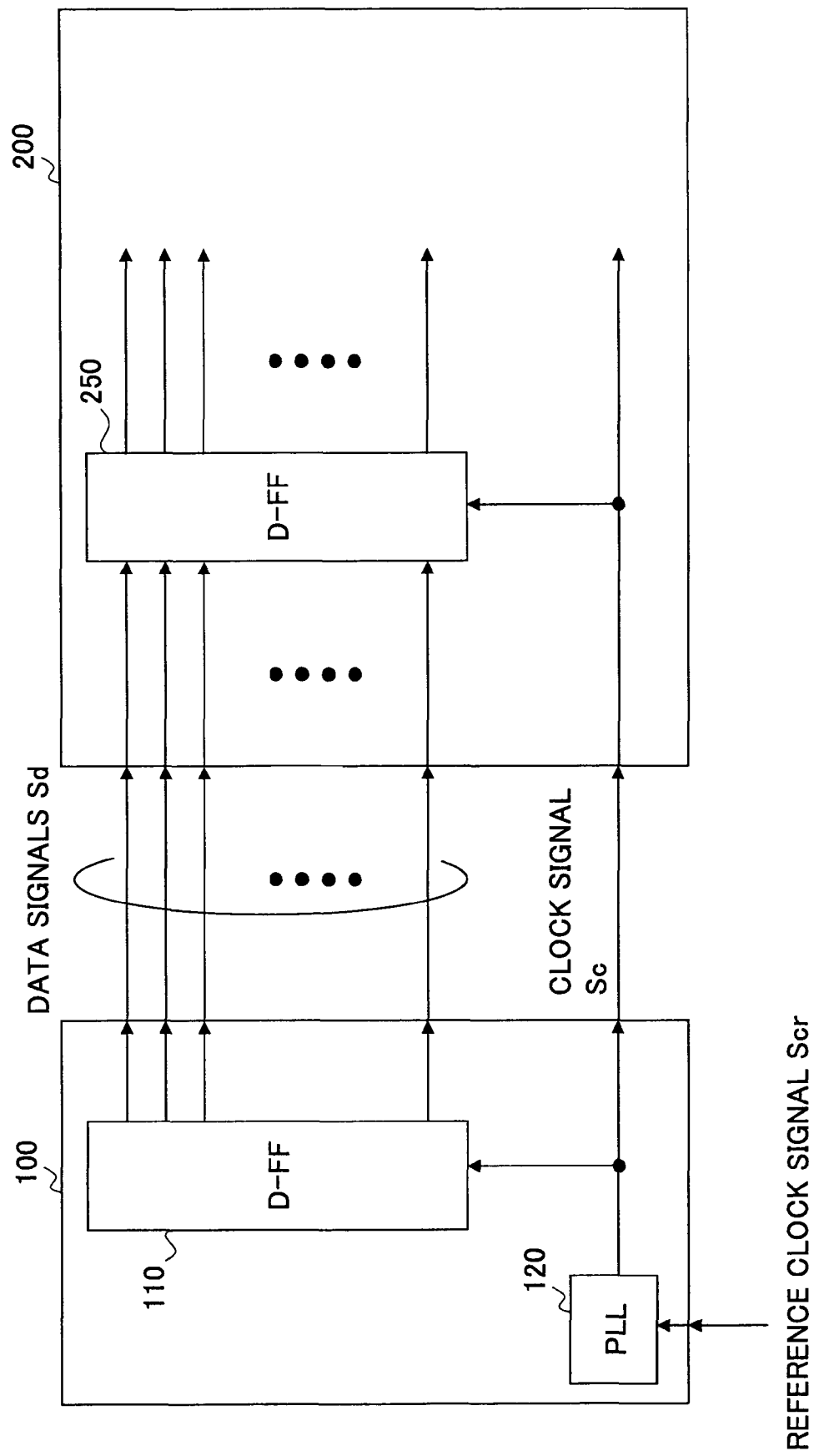
FIG. 2 shows a circuit configuration example for a case where a method (refereed to as a 'synchronization clock signal parallel flowing method', hereinafter) in which a synchronization clock signal and data signals are transmitted in a same direction is applied.

Next, for one exmaple of the above-mentioned second method (2), FIG. 2 shows a block diagram of a data processing circuit in one exmaple for a case of applying a scheme in which a clock signal Sc which is previously made in synchronization with data signals Sd is transmitted in a same direction as that of the data signals Sd.

In this case, it is assumed that circuit design is made in such a manner that delay amounts occurring in respective transmission paths of the data signals Sd and the clock signal Sc become substantially equal. Alternatively, design is made such that circuit configurations are made identical for the data signals Sd and the clock signal Sc to each other. As a result, it becomes possible to make substantially equal the fluctuation amounts of signal delay amounts between the respective transmission paths. Such design may be achieved with the necessity of considering factors depending on a signal transmission speed, an IC manufacturing process applied, and so forth.

In this method, a phase fluctuation which occurs due to jitter of a PLL circuit included in the transmission side circuit 100 is transmitted to the circuit 200 and also to the other subsequent circuits as it is. As a result, signal jitter characteristics may degrade.

Figure 3:
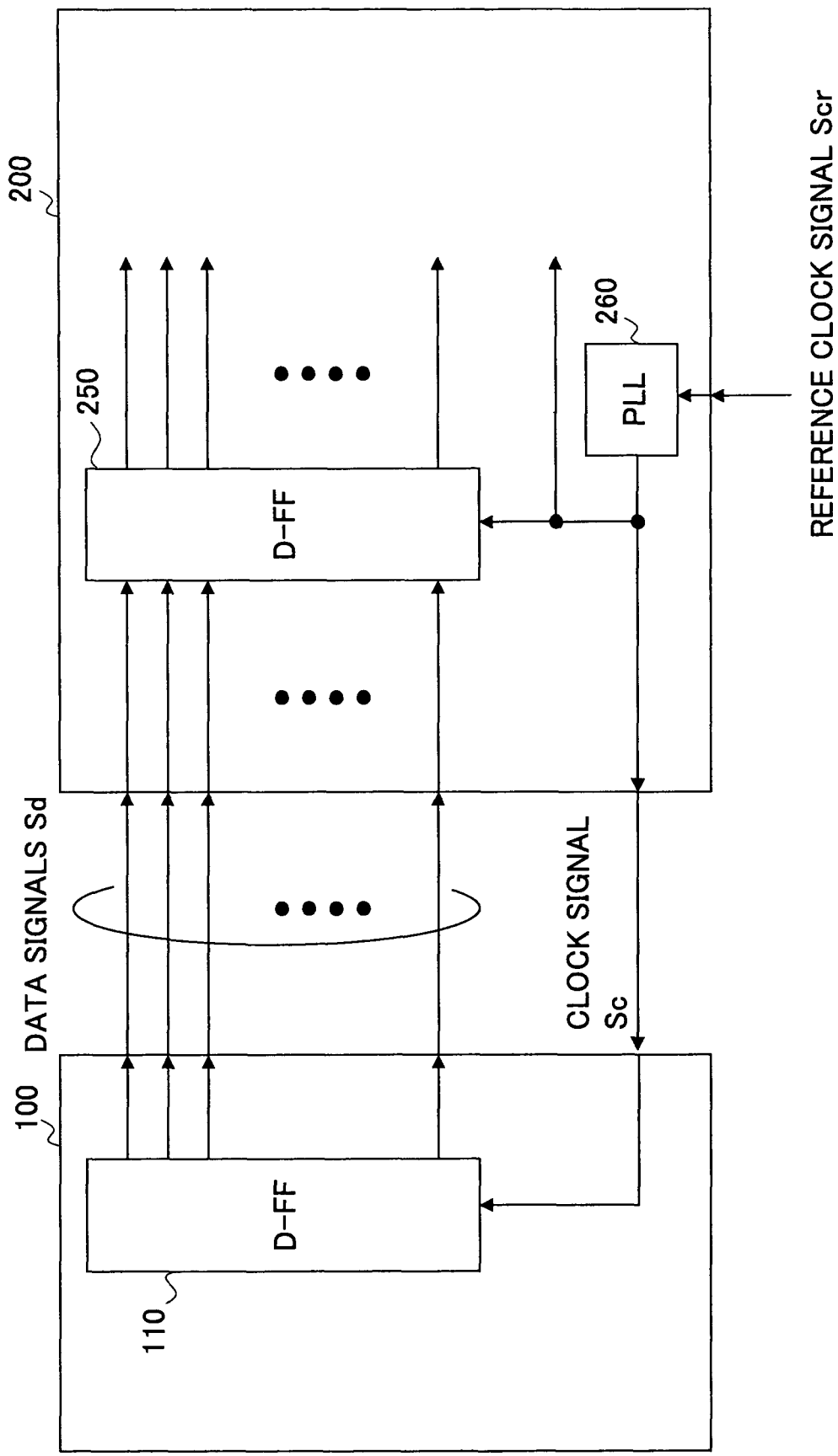
FIG. 3 shows a circuit configuration example for a case where a method (refereed to as a 'synchronization clock signal reverse flowing method', hereinafter) in which synchronization clock signal and data signals are transmitted in opposite directions is applied.

As another example of the above-mentioned second method (2), FIG. 3 shows a block diagram of a data processing circuit for a case where a clock signal made in phase with data signals is transmitted in a direction opposite to a direction in which the data signals are transmitted.

In this case, a PLL circuit 260 of a reception side circuit 200 is separate from a PLL circuit of a transmission side circuit 100. Accordingly, concerning a clock signal Sc output from the PLL circuit 260 of the reception side circuit 200, jitter characteristics is improved from that in the configuration of FIG. 2.

However, in the circuit configuration of FIG. 3, phase adjustment between the data signals Sd and the clock signal Sc carried out by a D-FF (D-flip flop) circuit 250 of the reception side circuit 200 is more difficult than that of the configuration of FIG. 2.

That is, in the configuration of FIG. 3, signal transmission delay occurring in cables or such connecting the respective circuits 100 and 200 should be necessarily managed further strictly. The reason therefor is described in detail. That is, in the configuration of FIG. 2, the clock signal Sc drives the D-FF circuit 110 of the transmission side circuit 100 so as to control output timing of the data signals Sd. After that, the clock signal Sc passes through the transmission path between the transmission side circuit 100 and the reception side circuit 200 as well as the data signals Sd, and thus reaches the reception side circuit 200. There, the clock signal Sc then drives the reception side D-FF circuit 250. Therefore, in this configuration, what affects a phase between the data signal and the clock signal in the D-FF circuit 250 of the reception side circuit 200 is only relative delay which is a difference between a time required for the data signals Sd output from the D-FF circuit 110 of the transmission side circuit 100 to reach the D-FF circuit 250 of the reception side circuit 200 and a time required for the clock signal Sc causing the data signals Sd to be thus output from the transmission side circuit 100 to reach the D-FF circuit 250 of the reception side circuit 200 in the same way. Thus, the respective absolute delay amounts thereof do not affect the phase adjustment. As a result, the phase adjustment may be carried out very easily in this case.

In contrast thereto, in the configuration of FIG. 3, the clock signal Sc generated in the PLL circuit 260 of the reception side circuit 200 drives the data signals Sd in the D-FF circuit 250 of the same circuit 200. After that, this clock signal Sc is transmitted to the transmission side circuit 100 in the reverse direction, and there, it drives the data signals Sd in the D-FF circuit 110. On the other hand, the data signals Sd are thus driven by the clock signal Sc in the D-FF circuit 110 of the transmission side circuit 100, and after that, the data signals Sd are transmitted to the reception side circuit 200, where the data signals Sd are driven by the clock signal Sc in the D-FF circuit 260 of the same circuit 200. In this configuration, the signal transmission directions thereof are opposite, and, as a result, absolute delay occurring in the go-and-return way of the transmission path between the circuits 100 and 200, exists between the clock signal Sc and the data signals Sd. As a result, an absolute value of the delay tends to amount to a large value, and thus, the phase adjustment therebetween tends to become relatively difficult.

Figure 4:
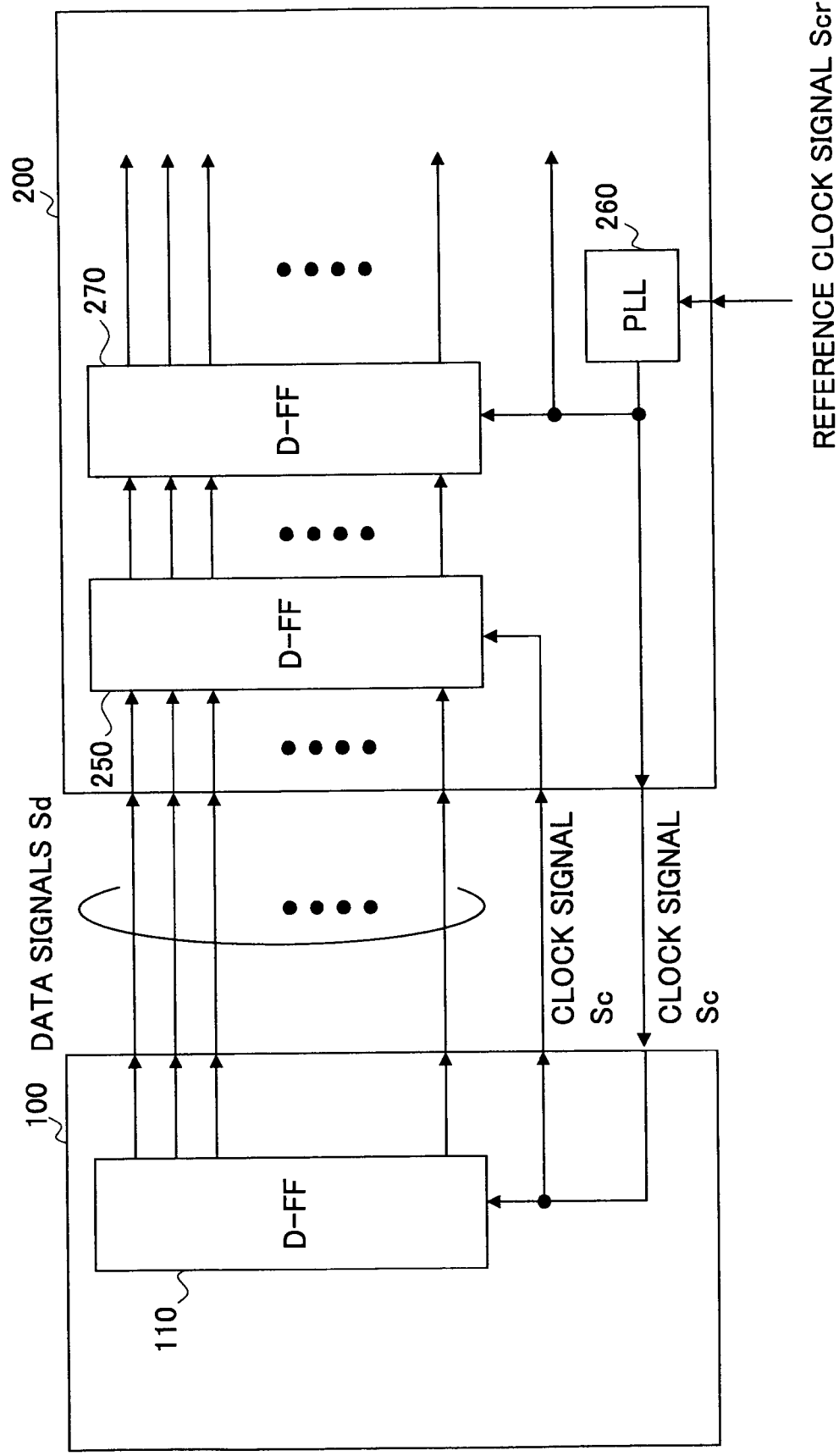
FIG. 4 shows a circuit configuration example for a case where a synchronization clock signal parallel and reverse flowing method is applied.

FIG. 4 shows a block diagram of a circuit configuration example for a case where synchronization clock signal parallel flowing type is further applied for the purpose of easing the difficulty of the phase adjustment of the circuit configuration of FIG. 3. In this case, double stages of D-FF circuits 250 and 270 are provided in the reception side circuit 200. Thereby, in comparison to the case of FIG. 3, it becomes possible to enlarge a margin for a variation/fluctuation of a phase difference between the data signals and the clock signal. That is, in the configuration of FIG. 4, after the clock signal Sc is generated by the PLL circuit 260 of the reception side circuit 200, the clock signal Sc is once transferred to the transmission side circuit 100, and there, the clock signal Sc drives the D-FF circuit 110. After that, the clock signal Sc is transmitted to the reception side circuit 200 together with the data signals Sd thus output by the D-FF circuit 110. Accordingly, since both the clock signal Sc and the data signals Sd are thus transmitted in the same direction, it is possible to control a phase difference therebetween within a relatively small range, and thus, it is possible to ease the difficulty of the phase adjustment.

However, even in the configuration of FIG. 4, it is still necessary to strictly manage the absolute delay occurring between the clock signal Sc and the data signals Sd with respect to driving timing of the clock signal Sc driving the D-FF circuit 270 of the reception side circuit 200, in the D-FF circuit 270 of the reception side circuit 200 the same as in the case of FIG. 3.

The present invention is directed to a circuit configuration for solving the above-mentioned problems, i.e., increase in the circuit size, jitter characteristic degradation, difficulty of the phase adjustment between the data signals and the clock signal and necessity of the strict management of the absolute delay between the data signals and the clock signal, and thus, for achieving high speed transmission of parallel data signals without data error.

Figure 5:
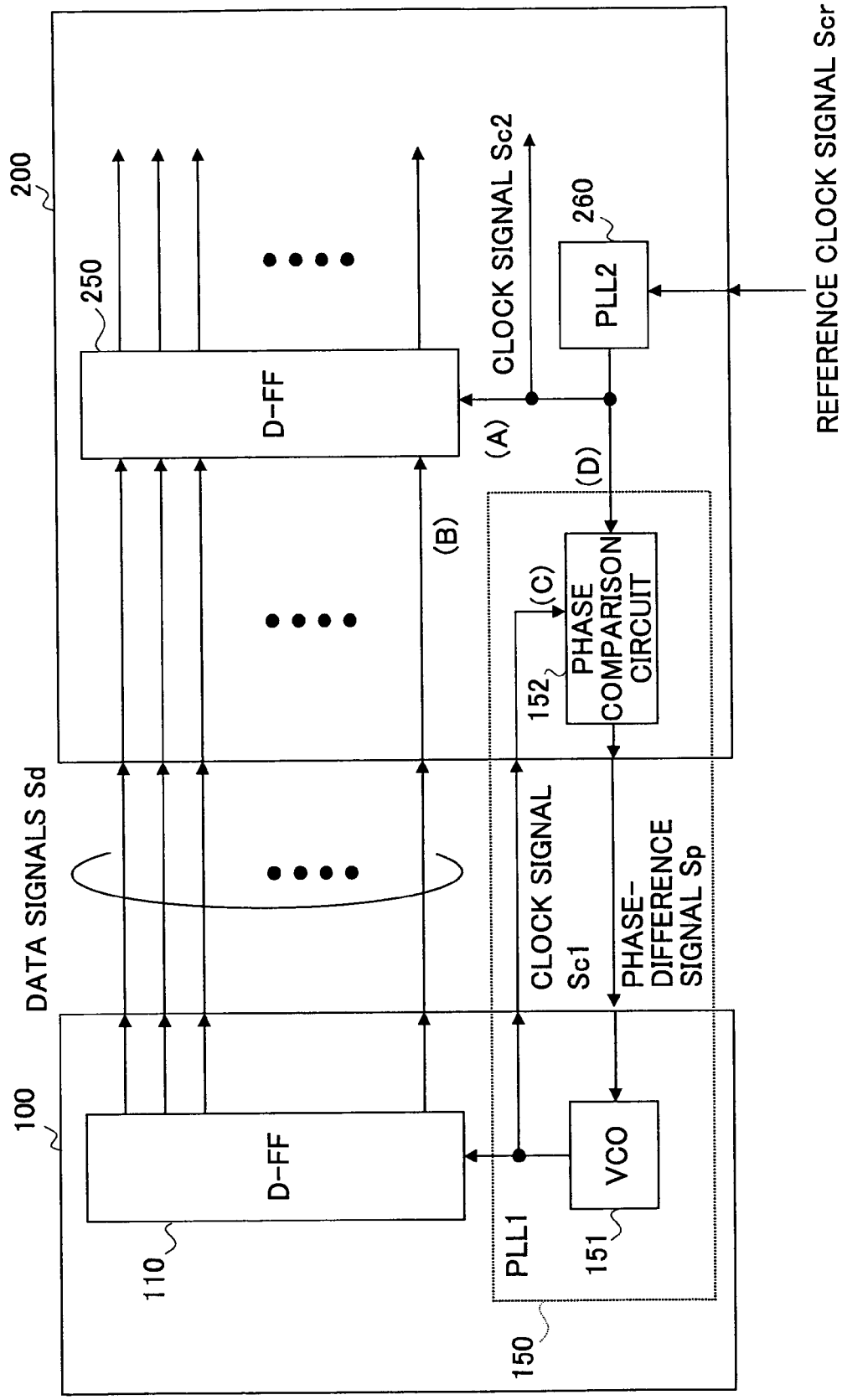
FIG. 5 shows a basic circuit configuration according to a first embodiment of the present invention.

FIG. 5 shows a block diagram of a data processing circuit according to a first embodiment of the present invention. In the circuit shown, a phase comparison circuit 152 of the PLL circuit 150 is moved to the reception side circuit 200 from the transmission side circuit 100.

In the circuit configuration shown in FIG. 5, by the function of the D-FF circuit 250 of the reception side circuit 200, a phase difference between the data signals Sd (B) input to the D-FF circuit 250 from the transmission side circuit 100 and a reception side clock signal Sc2 (A) also input to the same circuit 250 from a PLL circuit 260 of the reception side circuit 200 should be corrected precisely. For this purpose, a phase difference therebetween preferably should be as small as possible before the D-FF circuit 250.

A phase relationship between the data signals Sd (B) reaching at the reception side circuit 200 and a transmission side clock signal Sc1 (C) reaching the reception side circuit 200 in the configuration of FIG. 5 is on the same order as that of the phase relationship between the data signals Sd reaching the D-FF circuit 250 and the clock signal Sc reaching the same circuit 250 in the configuration of FIG. 2. This is because, both of them flow through the same transmission path between the circuits 100 and 200, as shown in FIGS. 2 and 5. Further, in the configuration of FIG. 5, the clock signal Sc2 (D) input to the phase comparison circuit 152 from the PLL circuit 260 of the reception side circuit 200 has the same phase as that of the above-mentioned clock signal Sc2 (A) since both of these signals flow within the same circuit 200.

However, in the configuration of FIG. 5, unlike in the configuration of FIG. 2, the transmission side clock signal Sc1 is not used to drive the reception side D-FF circuit 250. Instead, the reception side clock signal Sc2 generated from the reception side PLL circuit 260 is used to drive the same for the purpose of avoiding influence of jitter of the transmission side PLL circuit 150. Furthermore, in the data processing circuit according to the first embodiment shown in FIG. 5, for the purpose of further avoiding difficulty in the phase adjustment in the reception side circuit 200 between the data signals Sd and the clock signal Sc2 other wise occurring due to the provision of the separate PLL circuits 150 and 260 providing the respective clock signals Sc1 and Sc2, the transmission side PLL circuit 150 refers to the phase of the reception side clock signal Sc2.

That is, the phase comparison circuit 152 of the PLL circuit 150 of the transmission side circuit 100 compares the phases between the transmission side clock signal Sc1 (C) flowing in parallel to the data signals Sd from the transmission side circuit 100 and reaching the reception side circuit 200, with the clock signal Sc2 (D) of the reception side circuit 200. Then, based on a result of the phase comparison, a VCO 151 of the transmission side PLL circuit 150 is controlled with the use of a phase difference signal Sp according to a well-known function of a common PLL circuit. As a result, thanks to the phase lock function of the transmission side PLL circuit 150, the phase relationship between the signals (C) and (D) is fixed or well controlled. As a result, the above-mentioned phase between the signals (A) and (B) is fixed or reduced well accordingly. Thus, the phase adjustment between the data signals Sd (A) and the clock signal Sc2 (A) in the D-FF circuit 250 of the reception side circuit 200 can be eased, while the clock signal Sc2 of the reception side circuit 200 is separate from the clock signal Sc1 of the transmission side circuit 200 since they are generated by the respective separate PLL circuits 260 and 150, and thus, jitter of the transmission side PLL circuit 150 is prevented from affecting the clock signal Sc2 of the reception side circuit 200.

As a result, in this circuit configuration of FIG. 5, first, since a FIFO circuit or such is not used, it is possible to avoid increase in the circuit size. Second, since the clock signal Sc2 of the reception side circuit 200 which is further transmitted to the subsequent stage from the reception side circuit 200 is not affected by jitter of the PLL circuit 150 of the transmission side circuit 100 as mentioned above, the jitter characteristics are improved. Third, it is possible to reduce the difficulty of phase adjustment between the data signals Sd and the clock signal Sc in the reception side circuit 200 to the same amount as that in the configuration of FIG. 2 as a result of the phase of transmission side clock signal Sc1 is controlled with reference to the phase of the reception side clock signal Sc2 by means of the transmission side PLL circuit 150 as mentioned above. Fourth, since no clock signal flowing in the opposite direction from the reception side circuit 200 to the transmission side circuit 100 such as that in the configuration of FIG. 3 is applied, the above-mentioned absolute delay time mentioned does not occur. As a result, it is possible to achieve easier phase adjustment in the reception side circuit 200.

Figure 6:
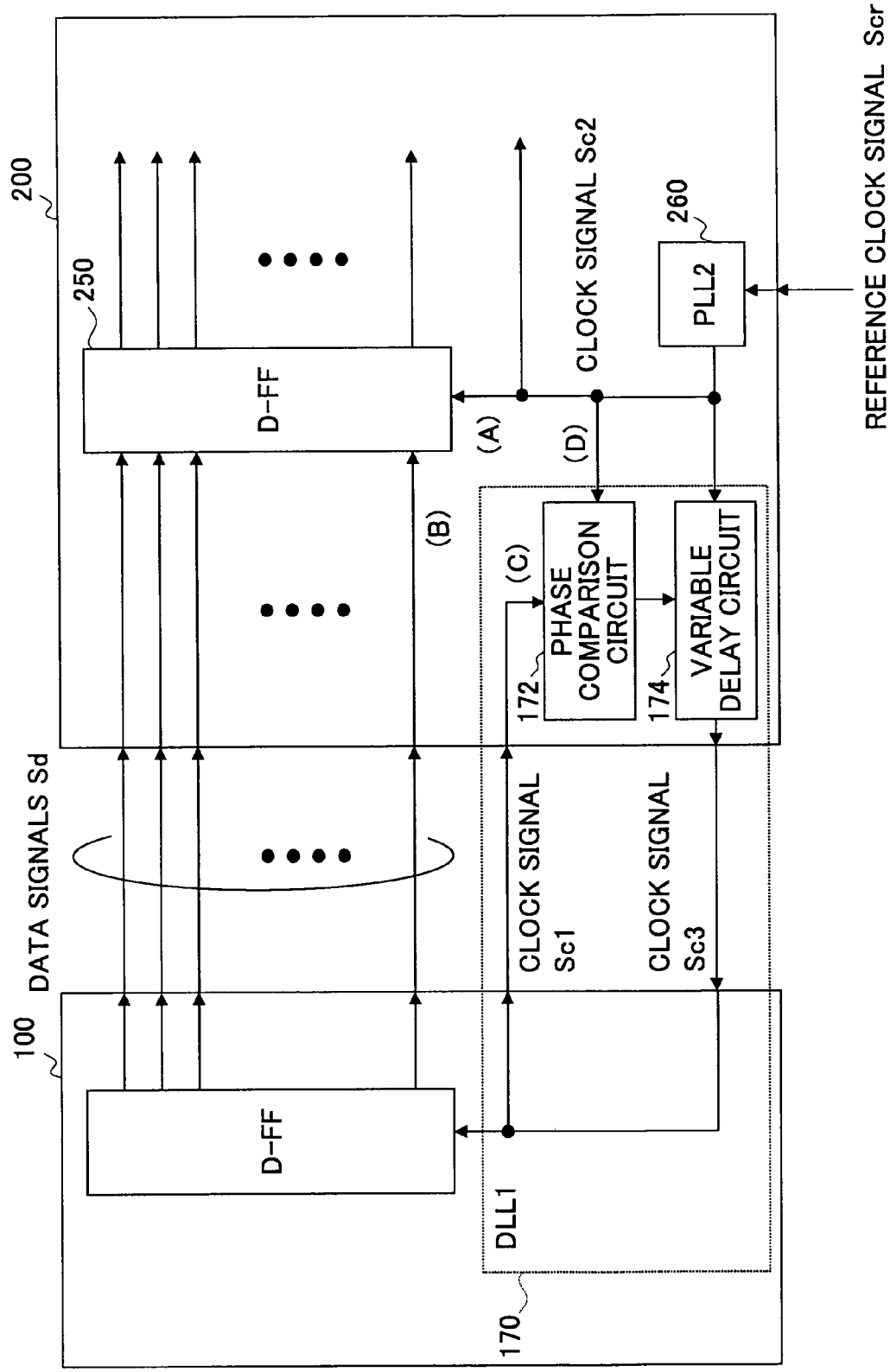
FIG. 6 shows a basic circuit configuration according to a second embodiment of the present invention.

FIG. 6 shows a block diagram of a circuit configuration according to a second embodiment of the present invention. What is different from the circuit configuration of the above-described first embodiment is that, instead of the PLL circuit 150, a DLL (delay lock loop) circuit 170 is used, and, also, instead of controlling of the VCO 151 with the output signal of the phase comparison circuit 152 in the PLL circuit 150, phase of a reverse flowing clock signal Sc3 flowing from the reception side circuit 200 to the transmission side circuit 100 is controlled by the DLL circuit 170.

That is, according to the second embodiment, phase (C) of a clock signal Sc1 of the transmission side circuit 100 transmitted from the transmission side circuit 100 and phase (D) of a clock signal Sc2 of the reception side circuit 200 provided by the reception side PLL 260 are compared with one another by means of a phase comparison circuit 172 of the DLL circuit 170, and thus, a phase of the reverse flowing clock signal Sc3 is controlled by means of a variable delay circuit 174 of the DLL circuit 170 in such a manner that phase between both clock signals Sc1 and Sc2 may be fixed or well controlled. In this configuration, even when the reverse flowing clock signal is used, no absolute delay time occurs, unlike either one of the cases of FIGS. 3 and 4. Thus, it is possible to obtain the same advantage as that of the first embodiment.

Thus, according to the present invention, phase of the synchronization clock signal Sc1 of the transmission side circuit 100 is controlled with reference to the synchronization clock signal Sc2 of the reception side circuit 200. Thereby, the reception side circuit 200 can always generate an independent synchronization clock signal. Accordingly, in comparison to the case of FIG. 2 in which the transmission side circuit 100 generates the synchronization clock signal separately, it is possible to effectively remove influence of jitter unique to the transmission side circuit 100 included in the transmission side synchronization clock signal, which jitter problem is necessarily involved by the circuit configuration of FIG. 2.

As a result, according to the present invention, it is possible to avoid degradation of the jitter characteristics and easily achieve high speed transmission of parallel data signals without data error. Therefore, even in a system in which optical transmission at very high speed such as 40 Gb/s, management of electric circuit connection among the respective circuits inside of the apparatus may be effectively eased.

Further specific examples of the above-described first and second embodiments of the present invention are described next.

Figure 7:
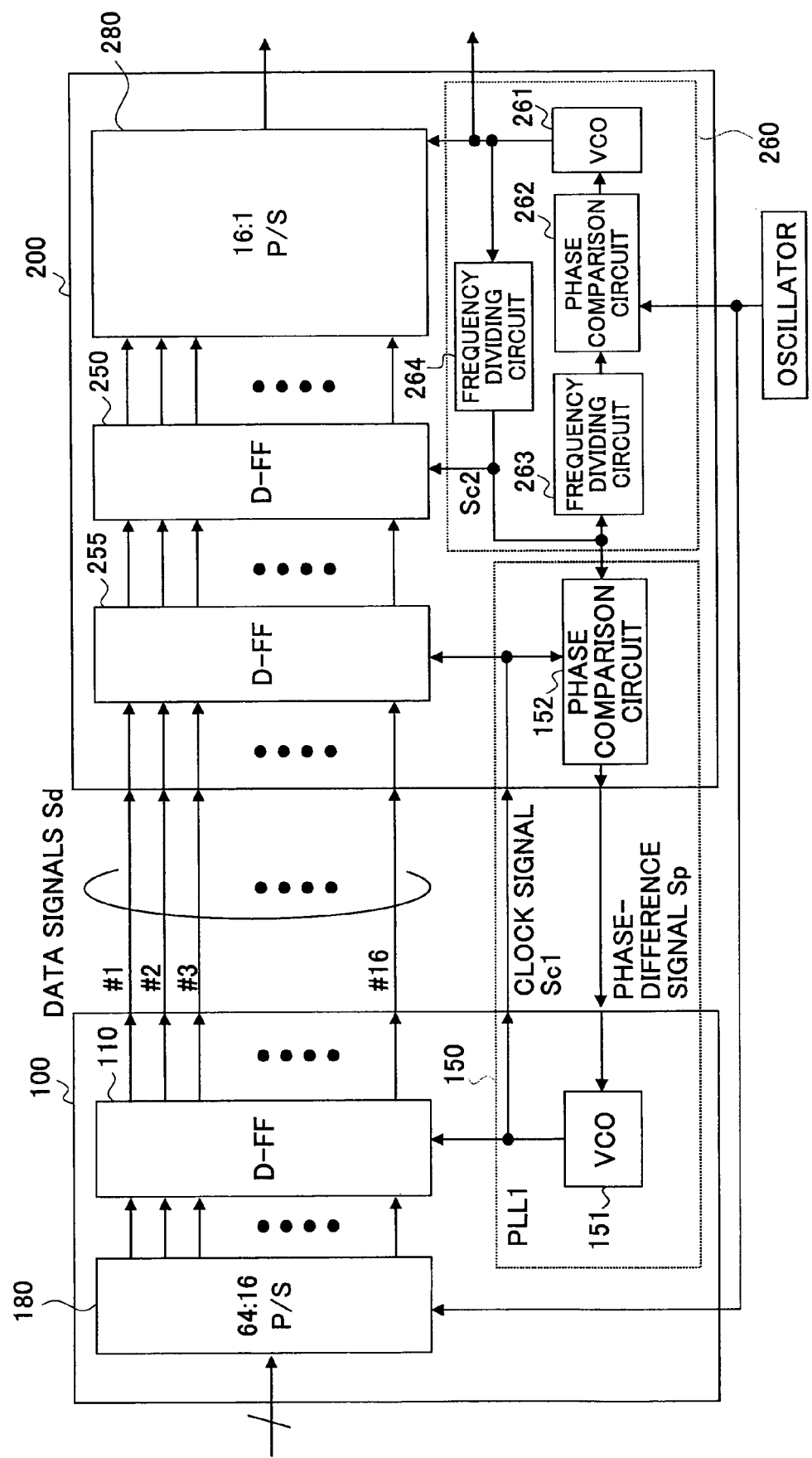
FIG. 7 shows a circuit block diagram of a specific example of the first embodiment of the present invention.

FIG. 7 shows a circuit configuration example for a case where a (64:1) parallel-to-serial conversion (P/S) circuit is made from a (64:16) P/S circuit and a (16:1) P/S circuit, and the configuration of the first embodiment is applied to circuit connection of 16 parallel data signals between these two P/S circuits.

In the configuration of FIG. 7, in a circuit 100, the (64:16) P/S circuit 180 converts 64 channels of parallel data of 600 Mb/s into 16 channels of parallel data of 2.5 Gb/s, and, the thus-obtained parallel data is then output as data signals Sd as a result of the parallel data being driven or undergoing phase adjustment by a clock signal Sc1 in a D-FF circuit 110.

In a circuit 200, the thus-output data signals Sd are received through a transmission path between the circuits 100 and 200, and first, are driven or phase-adjusted by the clock Sc1 in a D-FF circuit 255 again. In this circuit 200, a VCO 216, a phase comparison circuit 262, and two frequency dividing circuits 263 and 264 are provided to configure a PLL circuit 260. Thereamong, the frequency dividing circuit 263 carries out frequency dividing operation on a clock signal of 40 GHz output by the VCO 261 into a clock signal of 2.5 GHz, and provides the clock signal to a D-FF circuit 250. The D-FF circuit 250 again drives the data signals once driven in the D-FF circuit 255 by the clock signal Sc2 generated by the PLL circuit 260 of this circuit 200. As a result, it is possible to remove influence of jitter originating from a PLL circuit 150 of the circuit 100, which PLL circuit 150 is the same as the PLL circuit applied to the first embodiment shown in FIG. 5.

A reason why the D-FF circuit 255 is provided in front of the D-FF circuit 250 in the circuit configuration of FIG. 7 is as follows. That is, the data signals Sd transmitted from the circuit 100 to the circuit 200 are driven in this D-FF circuit 255 once by the clock signal Sc1 provided by the PLL 150 of the circuit 100 after they reaches the circuit 200. As a result, it is possible to easily correct a phase difference occurring due to signal transmission between the circuits 100 and 200. As a result of synchronization among the parallel data signals Sd being thus established once after they reach the circuit 200, it is possible to make easier phase adjustment then carried out in the D-FF circuit 250 by the clock signal Sc2 generated by the PLL circuit 260 of the circuit 200.

Then, the 16 parallel data signals Sd thus having undergone the phase adjustment to the clock signal Sc2 of the circuit 200 are converted into serial data of 40 Gb/s as a result of undergoing parallel-to-serial conversion by the (16:1) P/S circuit 280, and are transmitted to a circuit of a subsequent stage.

Figure 8:
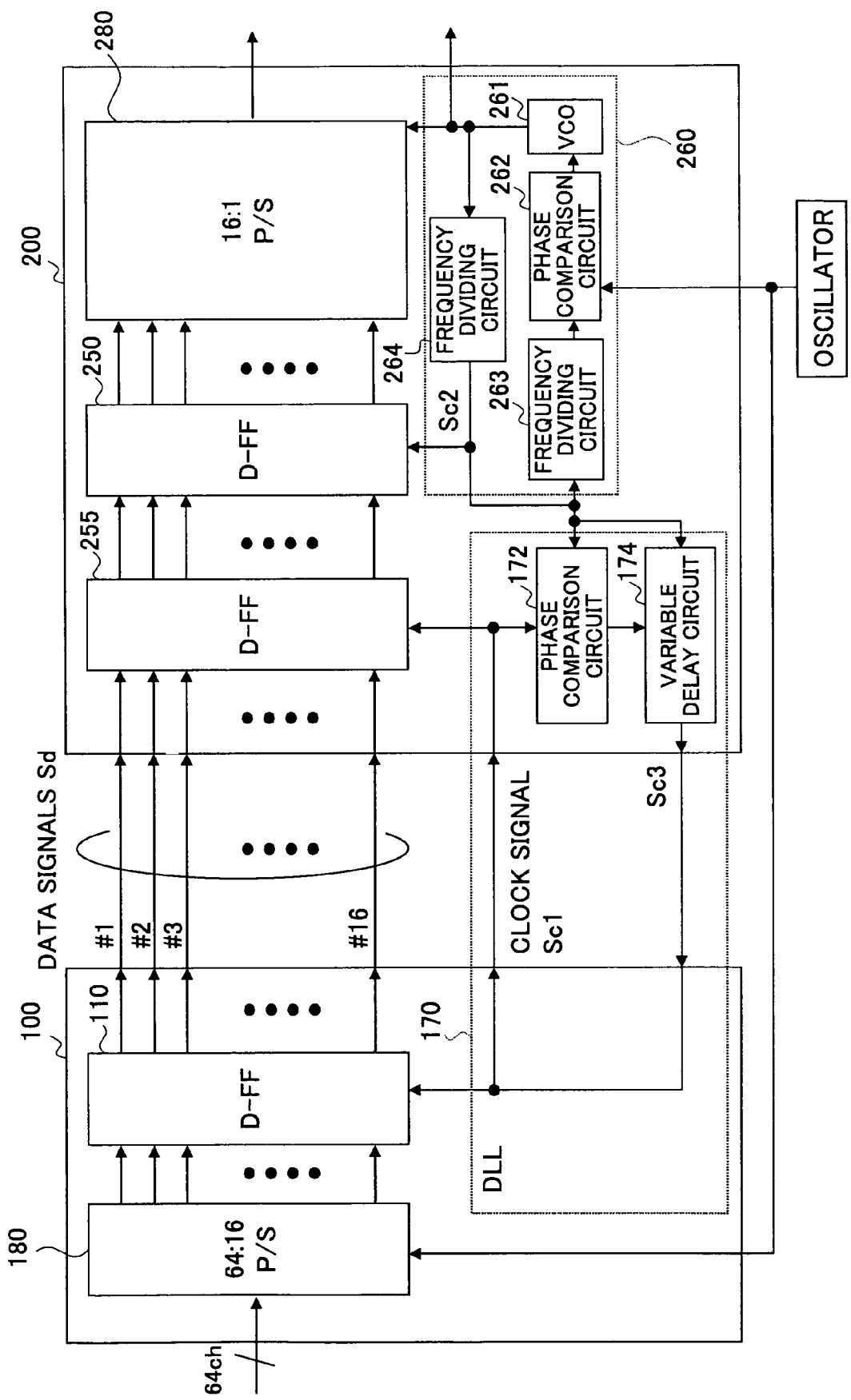
FIG. 8 shows a circuit block diagram of a specific example of the second embodiment of the present invention.

FIG. 8 shows a circuit configuration in which, the same as the example of FIG. 7, a (64:1) parallel-to-serial conversion (P/S) circuit is made from a (64:1) P/S circuit and a (16:1) P/S circuit, and the configuration of the above-described second embodiment of the present invention described above is applied for circuit connection of 16 parallel data signals between these two P/S circuits. This configuration of FIG. 8 is completely the same as that of FIG. 7 except that, the PLL circuit 150 of the circuit 100 is replaced by a DLL circuit 170 the same as the DLL 170 applied in the second embodiment shown in FIG. 6. Accordingly, this configuration has the same functions and advantages as those of the case of FIG. 7.

Figure 9:
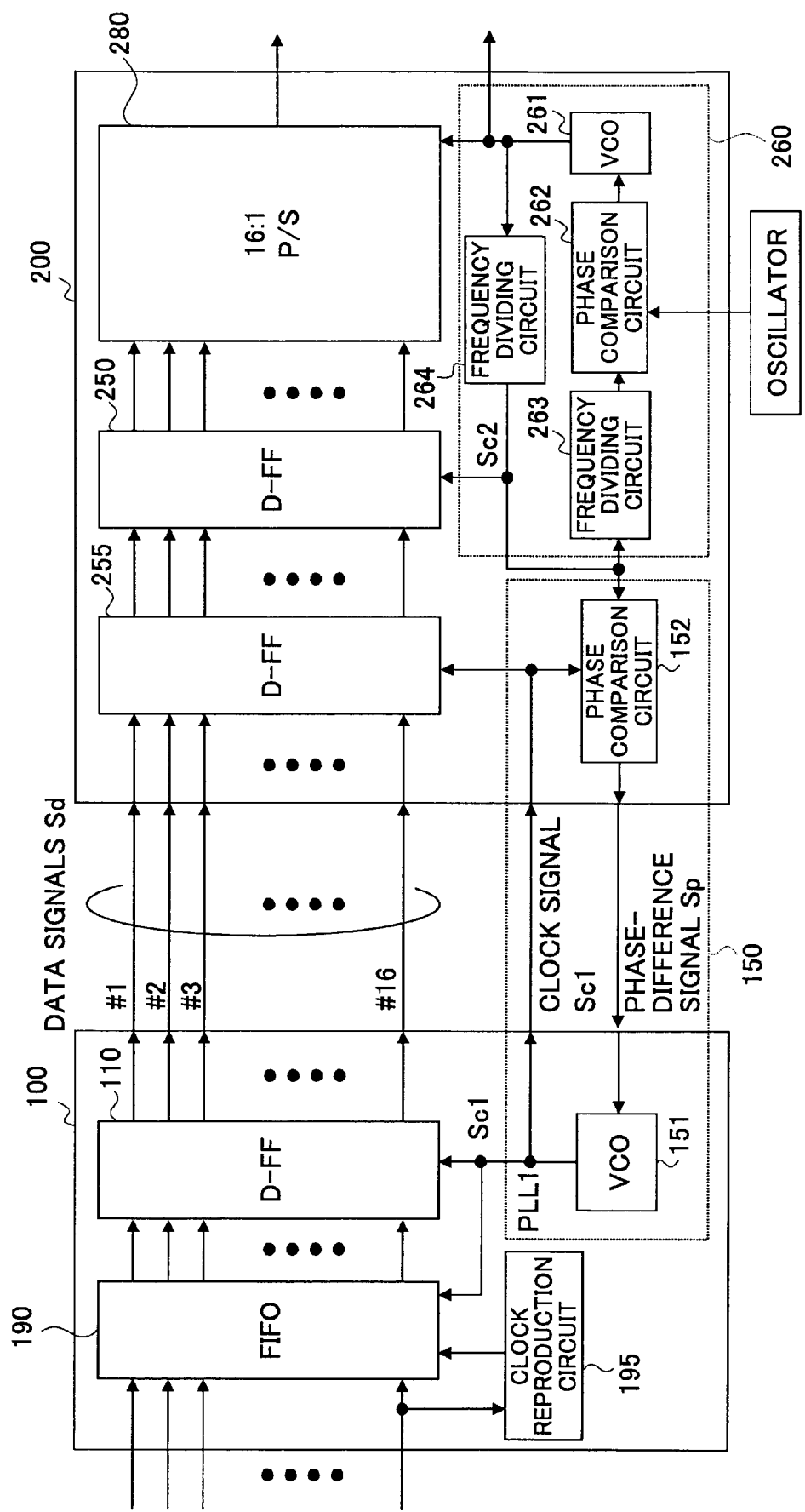
FIG. 9 shows a circuit block diagram of another specific example of according to the first embodiment of the present invention.

FIG. 9 shows a circuit configuration in which the configuration of the first embodiment of the present invention is applied to circuit connection between a 16 parallel signal interface conversion circuit and a (16:1) P/S circuit. In this case, a circuit 100 is a circuit carrying out predetermined interface conversion on 16 given parallel signals, and, for example, includes a FIFO circuit 190, as shown. The FIFO circuit 190 writes the input signals to an internal buffer with the use of a clock signal reproduced from the input signals in a clock reproduction circuit 195. The thus-written signals are then read out with the use of a clock signal Sc1 generated by a PLL circuit 150 of the circuit 100, are further driven by the same clock signal Sc1 in a D-FF circuit 110, and thus are output. The thus-output 16 parallel signals Sd of 2.5 Gb/s are received by a circuit 200 through a transmission path between the circuits 100 and 200. Processing carried out after that in the circuit 200 is same as that in the circuit 200 in the case of FIG. 8 described above.

The configuration of FIG. 9 also has the same functions and advantages as those of FIG. 7.

Figure 10:
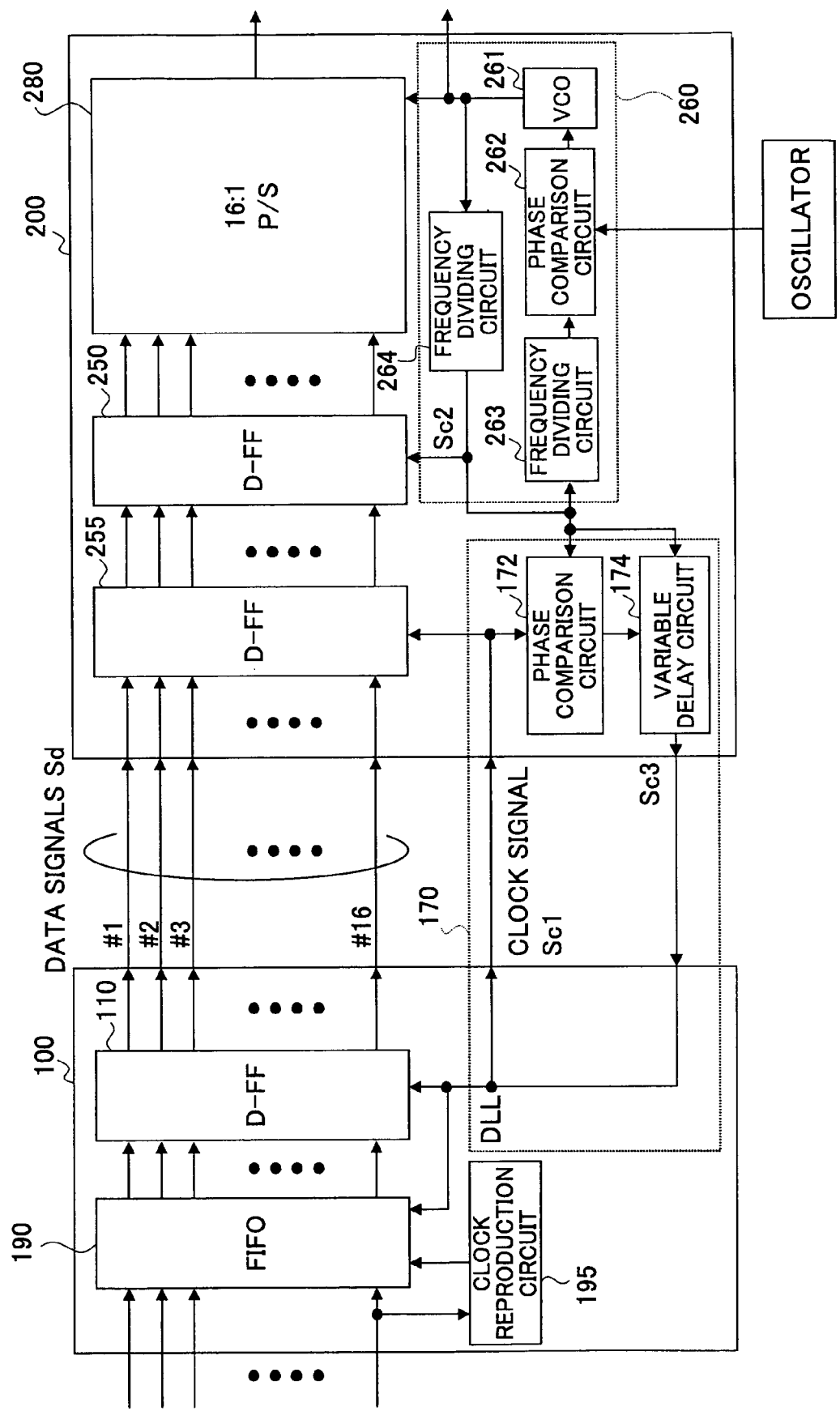
FIG. 10 shows a circuit block diagram of another specific example of according to the second embodiment of the present invention.

Further, FIG. 10 shows a circuit configuration in which the configuration of the second embodiment of the present invention is applied to connection between a 16 parallel signal interface conversion circuit and a (16:1) P/S circuit. This configuration of FIG. 10 is completely the same as that of FIG. 9 except that, the PLL circuit 150 of the circuit 100 is replaced by a DLL circuit 170 the same as the DLL 170 applied in the second embodiment shown in FIG. 6. Accordingly, this configuration has the same functions and advantages as those of the case of FIG. 9.

In a system carrying out optical signal transmission at very high speed such as 40 Gb/s, in many cases, a circuit carrying out speed conversion between input/output signals, such as a data multiplexing circuit, has its own unique PLL circuit. Even for such a case, by applying the present invention described above, it becomes possible to improve a phase margin, jitter characteristics, or such, even with a relatively simple configuration without substantially increasing the circuit size.

Further, the present invention is not limited to the above-described embodiments, and variations and modifications may be made without departing from the basic concept of the present invention claimed below.

What is claimed is:

1. A signal processing system comprising:
    a first signal processing circuit comprising a first flip flop circuit outputting parallel data signals and a first part of a first PLL circuit providing a first clock signal to the first flip flop circuit for outputting the parallel data signals from the first flip flop circuit at a timing of the first clock signal; and
    a second signal processing circuit comprising a second flip flop circuit and a third flip flop circuit, the second flip flop circuit receiving the parallel data signals output from the first signal processing circuit via a transmission path, and the third flip flop circuit receiving parallel data signals from the second flip flop circuit via a transmission path, a second part of the first PLL circuit providing a first clock signal to the second flip flop circuit, and a second PLL circuit providing a second clock signal to the third flip flop circuit, the third flip flop circuit outputting the parallel data signals received from the second flip flop circuit at a timing of the second clock signal, wherein:

the second part of the first PLL circuit comprises a phase comparison circuit carrying out phase comparison between the first clock signal transmitted from the first part of the first PLL circuit via a clock transmission path between the first and second signal processing circuits and the second clock signal provided by the second PLL circuit; and the first PLL circuit is configured to control, based on a comparison result of the phase comparison circuit, phase of the first clock signal to provide in such a manner that a phase difference between the first clock signal and the second clock signal is fixed in the second signal processing circuit.

2. The signal processing system as claimed in claim 1, wherein:

the first signal processing circuit comprises a first parallel-to-serial conversion circuit part carrying out serialization and reducing the number of parallel data signals by a first predetermined rate into the parallel data signals that are output by the first flip flop circuit; and the second signal processing circuit comprises a second parallel-to-serial converting circuit part carrying out further serialization and reducing the number of the parallel data signals, output by the second flip flop circuit, by a second predetermined rate.

3. The signal processing system as claimed in claim 1, wherein:

the first signal processing circuit comprises an interface conversion circuit part carrying out predetermined interface conversion on the parallel data signals; and the second signal processing circuit comprises a parallel-to-serial converting circuit part carrying out serialization and reducing the number of the parallel data signals by a predetermined rate.

4. A signal processing system comprising:

a first signal processing circuit comprising a first flip flop circuit outputting parallel data signals and a first part of a DLL circuit providing a first clock signal to the first flip flop circuit for outputting the parallel data signals from the first flip flop circuit at a timing of the first clock signal; and a second signal processing circuit comprising a second flip flop circuit and a third flip flop circuit, the second flip flop circuit receiving the parallel data signals output from the first signal processing circuit via a transmission path, and the third flip flop circuit receiving parallel data signals from the second flip flop circuit via a transmission path, a second part of the DLL circuit providing a first clock signal to the second flip flop circuit, and a PLL circuit providing a second clock signal to the third flip flop circuit, the third flip flop circuit outputting the parallel data signals received from the second flip flop circuit at a timing of the second clock signal, wherein:

the second part of the DLL circuit comprises a phase comparison circuit carrying out phase comparison between the first clock signal transmitted from the first part of the DLL circuit via a clock transmission path between the first and second signal processing circuits and the second clock signal provided by the PLL circuit; and the DLL circuit is configured to control, based on a comparison result of the phase comparison circuit, phase of the first clock signal to provide in such a manner that a phase difference between the first clock signal and the second clock signal is fixed in the second signal processing circuit.

5. The signal processing system as claimed in claim 4, wherein:

the first signal processing circuit comprises a first parallel-to-serial conversion circuit part carrying out serialization and reducing the number of parallel data signals by a first predetermined rate into the parallel data signals that are output by the first flip flop circuit; and the second signal processing circuit comprises a second parallel-to-serial converting circuit part carrying out further serialization and reducing the number of the parallel data signals, output by the second flip flop circuit, by a second predetermined rate.

6. The signal processing system as claimed in claim 4, wherein:

the first signal processing circuit comprises an interface conversion circuit part carrying out predetermined interface conversion on the parallel data signals; and the second signal processing circuit comprises a parallel-to-serial converting circuit part carrying out serialization and reducing the number of the parallel data signals by a predetermined rate.

* * * * *